(12) United States Patent
Wood et al.

(10) Patent No.: US 6,835,247 B2
(45) Date of Patent: Dec. 28, 2004

(54) ROD REPLENISHMENT SYSTEM FOR USE IN SINGLE CRYSTAL SILICON PRODUCTION

(75) Inventors: Henry D. Wood, Moses Lake, WA (US); John Peter Hill, Moses Lake, WA (US); Jay Curtis Nelson, Moses Lake, WA (US); William John Juhasz, Jr., South Bend, IL (US); Howard J. Dawson, Anacortes, WA (US)

(73) Assignee: Advanced Silicon Materials LLC, Silver Bow, MT (US)

( * ) Notice: Subject to any disclaimer, the term of this patent is extended or adjusted under 35 U.S.C. 154(b) by 496 days.

(21) Appl. No.: 10/040,240

(22) Filed: Oct. 26, 2001

(65) Prior Publication Data

US 2002/0108557 A1 Aug. 15, 2002

Related U.S. Application Data

(60) Provisional application No. 60/244,774, filed on Oct. 31, 2000.

(51) Int. Cl.[7] ............................................. C30B 35/00
(52) U.S. Cl. ...................... 117/218; 117/208; 117/217; 117/900; 117/911
(58) Field of Search ................................ 117/208, 217, 117/218, 900, 911

(56) References Cited

U.S. PATENT DOCUMENTS

| | | | | |
|---|---|---|---|---|
| 5,833,750 A | * | 11/1998 | Mizuishi et al. | ............ 117/218 |
| 5,879,448 A | * | 3/1999 | Urano et al. | ................ 117/218 |
| 5,935,328 A | * | 8/1999 | Cherko et al. | .............. 117/218 |
| 5,948,164 A | * | 9/1999 | Iida et al. | .................... 117/218 |
| 6,444,028 B2 | * | 9/2002 | Frauenknech et al. | ...... 117/218 |
| 6,461,426 B2 | | 10/2002 | Inoue et al. | |
| 2001/0047748 A1 | | 12/2001 | Fruenknecht et al. | |

FOREIGN PATENT DOCUMENTS

| | | |
|---|---|---|
| JP | 2000-178096 | 6/2000 |
| JP | 2000-313690 | 11/2000 |
| JP | 2000-344594 | 12/2000 |
| JP | 2001-19587 | 1/2001 |

* cited by examiner

Primary Examiner—Felisa Hiteshew
(74) Attorney, Agent, or Firm—Klarquist Sparkman, LLP

(57) ABSTRACT

A system is disclosed for efficient utilization of charge replenishment rods in Czochralski silicon crystal growing processes.

24 Claims, 5 Drawing Sheets

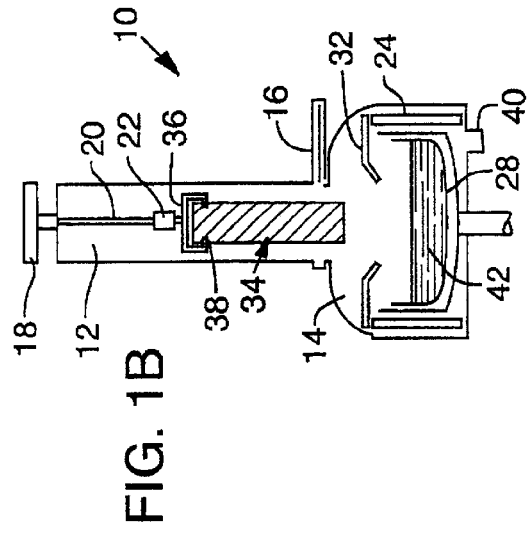
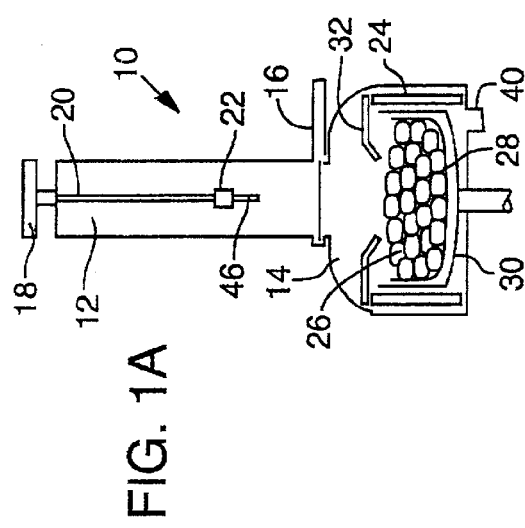
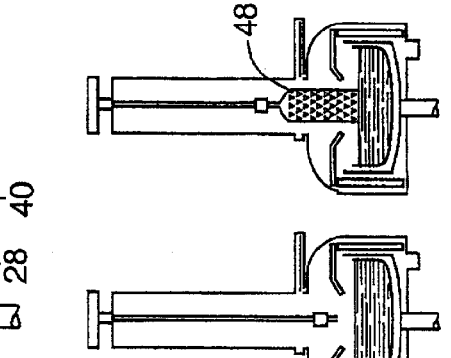
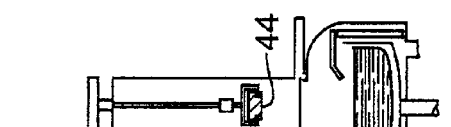
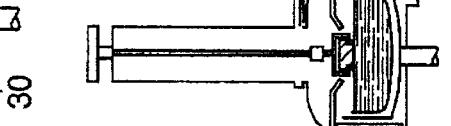
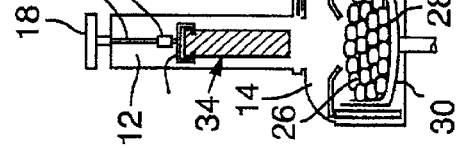
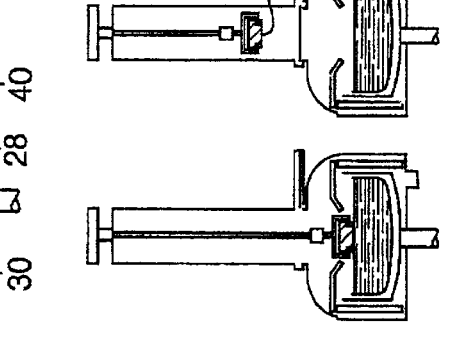
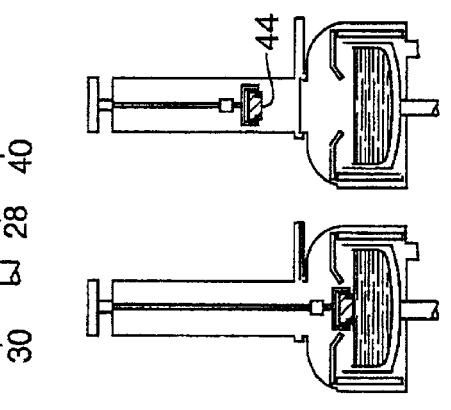

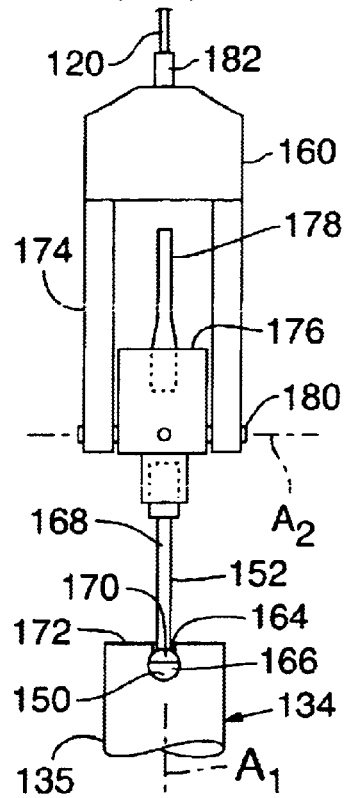
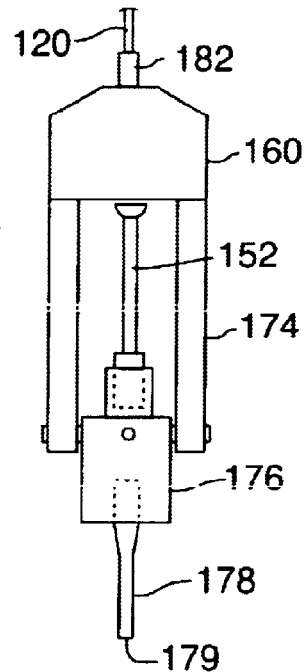
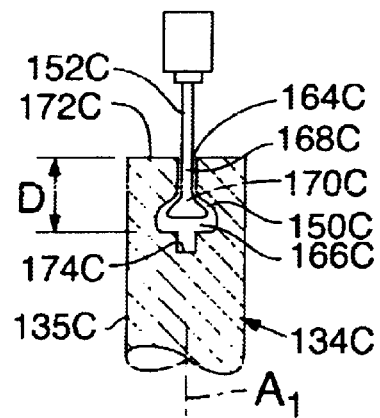
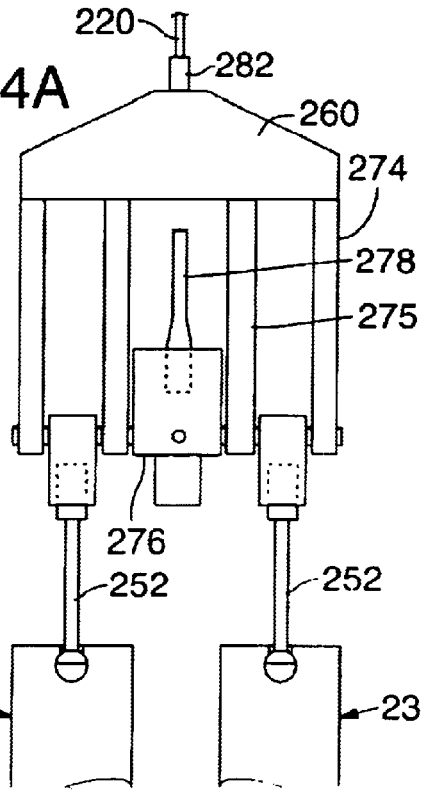
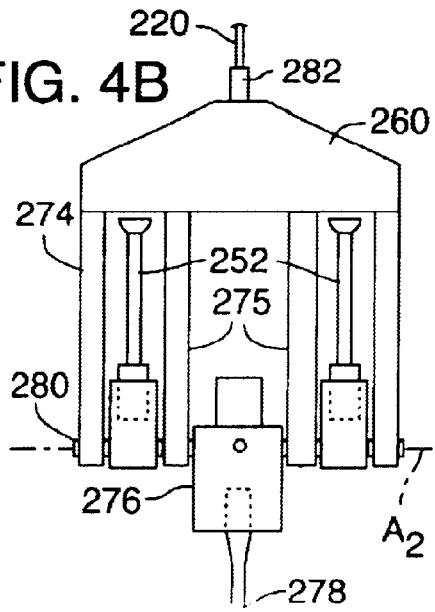

ROD REPLENISHMENT SYSTEM FOR USE IN SINGLE CRYSTAL SILICON PRODUCTION

This claims the benefit of Provisional Application No. 60/244,774, filed Oct. 31, 2000.

BACKGROUND AND SUMMARY

The present invention relates to improving the efficiency of systems for producing single crystal silicon by the Czochralski (CZ) method. More particularly the invention relates to the hanging of charge replenishment rods in CZ furnaces.

The major process for producing single crystal silicon ingots for the electronic industry is the CZ process. In the CZ process chunks of polycrystalline silicon are loaded into a quartz crucible. The crucible is loaded into a furnace, which is sealed and evacuated. The polycrystalline silicon is melted under vacuum and once the melt has been stabilized a single crystal silicon seed of the correct orientation is inserted into the melt. A silicon single crystal ingot of the correct diameter and orientation is pulled from the melt. This ingot is used to produce silicon wafers, which are the major starting material for the electronics industry. Wafers from the CZ process are used predominately for the production of integrated circuits.

One of the limitations of the CZ process has been that the quartz crucible can be used only a few times. This is due to the differences of thermal expansion of the polycrystalline silicon and the quartz so that once the CZ process is finished and the heat is removed, it is common for the quartz crucible to crack.

In order to address this issue, a number of attempts have been made at evaluating alternative crucible materials. These have included coating quartz with $Si_3N_4$ or other ceramic materials. These have met very limited success due to the overall purity requirements of single crystal silicon.

Another approach that has been attempted is to extend the length of time a quartz crucible can be used. This approach includes development of semi-continuous CZ crystal growth processes. A semi-continuous process typically involve the use of a feeding tube through which small polycrystalline silicon chips or fluid bed (granular) polycrystalline silicon can be fed. In such a semi-continuous process the crucible can be topped off with chips or granular polycrystalline silicon. Or an ingot could be pulled, then removed, and additional polycrystalline silicon added to the remaining melt. In this manner, the crucible can be used for an extended period. Unfortunately, due to the potential for surface contamination that occurs with chips and granular polycrystalline silicon, such techniques have not won widespread acceptance in the industry.

Another alternative is to recharge the crucible with rods of polycrystalline silicon. This process is called charge replenishment (CR). Typically, a ring ditch is fabricated onto the cylindrical surface of a polycrystalline silicon rod and a holder is fastened to the ring ditch. The holder is attached to the seed holder of a CZ furnace so the assembly can be raised or lowered in the furnace. Thus the rod can be slowly lowered into the silicon melt and melted in. In this manner the crucible can be refilled with molten silicon, without reducing the temperature to the extent that the crucible cracks, such that another single crystal ingot can be pulled. This replenishment process can be repeated.

The current processes for recharging with rods have procedural limitations. For example, the loading of a new rod into the CZ furnace requires segregating the silicon melt from an upper chamber of the furnace by operation of an isolation valve. This requires time and has the potential for contamination from the isolation valve since it must be opened and closed several times. Each time the isolation valve is opened or closed it has the potential to drop impurities into the silicon melt. And once the polycrystalline silicon is melted the holding mechanism needs to be removed via the upper chamber. This requires isolating the melt with the isolation valve and removing the fastening equipment and the unmelted polycrystalline silicon residue. Then the seed can be attached and the upper chamber is evacuated. The isolation valve then must be opened so the seed can be dipped into the melt.

The current procedures thus may have one or more problems, such as delays in the crystal growing process due to the need for isolation from the molten silicon and the attachment of the rod and the removal of the rod holder, and the number of times the isolation valve must be opened and closed, which increases the potential for contamination of the silicon melt.

Thus there remains a need for ways for CZ crystal growers to increase their yields by using CR rods to increase the melt volume and therefore increase the length of the single crystal ingot they can produce. In addition for those that are already using CR rods, there is a need for ways to allow for the complete utilization of the CR rod and for reducing the number of times the isolation valve has to be opened.

BRIEF DESCRIPTION OF THE DRAWINGS

In the drawings:

FIGS. 1A and 1B are schematic vertical cross-sectional views of a CZ furnace.

FIGS. 2A–2G are schematic vertical cross-sectional views depicting the current use of CR polycrystalline silicon rods.

FIGS. 3A and 3B are schematic views of a CR mechanism, including a keyhole system, for holding a single polycrystalline silicon rod;

FIG. 3C is a schematic vertical cross-sectional view of another keyhole system for hanging polycrystalline silicon rods.

FIGS. 4A and 4B are schematic views of a CR mechanism for holding a two polycrystalline silicon rods;

DETAILED DESCRIPTION

Figure 5:
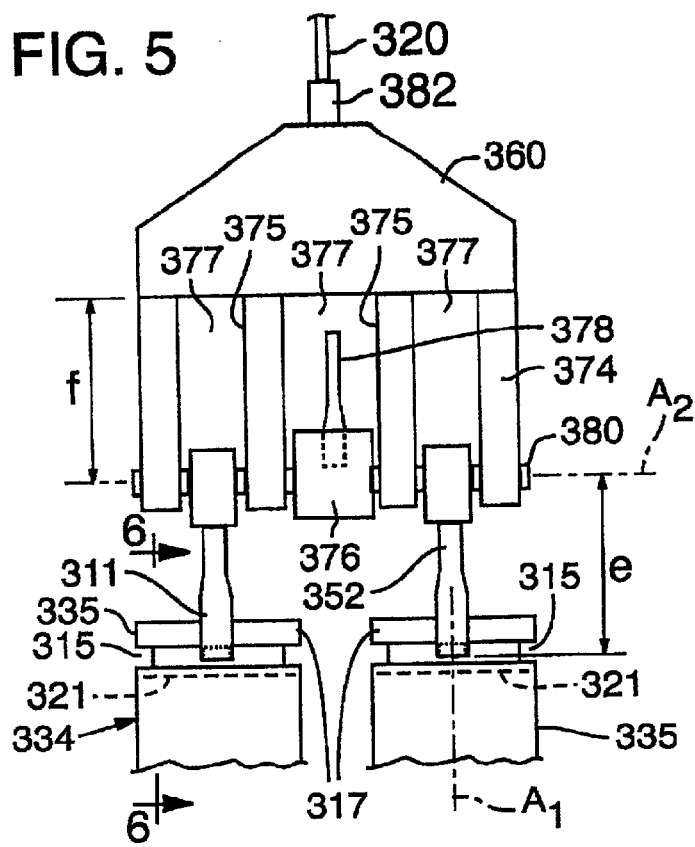
FIG. 5 is a schematic view of another CR mechanism for holding a two polycrystalline silicon rods.

A typical CZ puller 10, as shown in FIGS. 1A and 1B, has two parts, an upper chamber 12 and a lower furnace chamber 14. These two chambers are separated by an isolation valve 16. The puller 10 has a lift mechanism that includes a cable or shaft pulley system 18 in the upper chamber 12. The pulley system 18 is connected to a cable or shaft 20 that is used for raising or lowering silicon inside the puller 10. At the end of the cable or shaft is a seed holder 22, which can be used either to attach a CR rod to the cable or shaft, or to hold a single crystal silicon seed.

The lower furnace chamber 14, which can be isolated from the upper chamber 12 by the isolation valve 16, contains a heater 24 used to melt polycrystalline silicon chunks 26 inside a quartz crucible 28. The quartz crucible 28 can be raised or lowered within the heater by a susceptor 30. Depending on the type of single crystal silicon that is being grown, a heat shield 32 may be installed after the quartz crucible 28 is loaded with silicon chunks to be melted.

The normal operation of the CZ furnace with a ring ditched charge replenishment (CR) rod is shown sequentially in FIGS. 2A–2G. FIG. 2A shows the CZ furnace loaded with chunk polycrystalline silicon 26 in the quartz crucible 28 in the lower furnace chamber 14. A polycrystalline silicon rod 34 is attached to the seed holder 22 using a clamp or wire 36 that extends into a ring ditch 38 in the polycrystalline silicon rod 34 so that the rod hangs over the crucible. Both the upper and lower chambers 12, 14 are evacuated via a vacuum port 40 with the isolation valve 16 open.

The polycrystalline silicon chunk 26 is melted using the heater 24 to form a melt 42, that is a body of molten silicon. After the polycrystalline silicon chunk 26 is melted, the polycrystalline silicon rod 34 is lowered into the lower furnace chamber 14 so that it can be preheated by the heater 24. FIG. 2B shows the position of the polycrystalline silicon rod 34 just prior to contact with the molten silicon 42. The polycrystalline silicon rod 34 is slowly lowered into the silicon melt 42 in a manner such that the melting rate of the rod 34 is faster than the lowering rate so that no appreciable amount of the rod is ever submerged in the melt 42.

The polycrystalline silicon rod 34 is melted from the bottom up to a level just below the ring ditch attachment 36 as shown in FIG. 2C. Contact between ring ditch attachment 36 and the silicon melt 42 is not allowed due to the potential for contamination. Therefore, the lowering is stopped prior to contact of the bottom of the ring ditch attachment 36 and the melt 42, so that a small portion 44 of the polycrystalline silicon rod 34 remains unmelted.

This unmelted portion 44 of the polycrystalline silicon rod 34 must then be raised up into the upper chamber 12 and the isolation valve 16 closed as is shown in FIG. 2D. The vacuum in the upper chamber 12 is released, the upper chamber opened and the remaining portion 44 of the polycrystalline silicon rod 34 is removed. A single crystal seed 46 is then attached to the seed holder 22 as shown in FIG. 2E. The upper chamber 12 is then evacuated, the isolation valve 16 opened and the single crystal seed 46 is lowered toward the silicon melt 42 as shown in FIG. 2F. Next the single crystal seed 46 is lowered into the silicon melt 42, whereafter the lift mechanism is reversed to start the pulling a single crystal silicon ingot 48 as shown in FIG. 2G.

This process requires that the isolation valve 16 be opened and closed twice during the crystal growth cycle. Each time this valve 16 is opened or closed it has the potential to allow impurities to fall into silicon melt 42. These impurities can lead to the formation of defects or loss of structure of the single crystal silicon, which will reduce the yield.

FIGS. 3–7 show rod replenishment mechanisms (RRMs) that advantageously allow the melting of one or more polycrystalline rods and then the dipping of single crystal seed into the melt without intervening processing steps.

In the system of FIGS. 3A and 3B, an RRM includes a support body 160, a rod holder 152 extending from the support body 160, and a single crystal seed 178 connected to the rod holder. The RRM hangs from a lift mechanism 120 and supports a polycrystalline silicon rod 134 so that the rod hangs over a crucible. The illustrated support body 160 is a yoke that has two downwardly extending spaced-apart legs 174. The support body 160 is made of a material, such as quartz, molybdenum, tungsten or steel, that has sufficient strength to support the rod 134.

The RRM has a rod holder that is a hanger 152 extending from the support body 160 and connecting directly to the polycrystalline silicon rod 134. The rod holder 152 can be made out of quartz, silicon or some other non-contaminating material.

FIGS. 3A and 3B show a keyhole system for attaching a CR rod to the rod holder 152. The polycrystalline silicon rod 134 has a surface that includes a top surface 172, a bottom surface (not shown), and a generally cylindrical side surface 135 that extends between the top and bottom surfaces. The rod 134 has a central axis $A_1$ that is surrounded by and extends generally parallel to the side surface 135. The top surface 172 is at the attached end of the rod when suspended. The bottom surface is at the free end of the rod, which free end is nearest the crucible when the rod is suspended.

As used herein, terms such as "cylindrical," "circular," and "spherical" should be taken in their broad senses. Although the term "circular" may be used herein, a typical polycrystalline silicon CR rod, as viewed from an end, is not perfectly circular, but is instead slightly elliptical in cross-section due to the ways in which such rods are grown. And the cross-section is not a mathematically perfect ellipse, but is somewhat irregular. A "cylindrical" rod could be any elongated rod having a side surface generally as traced by a straight line moving parallel to a fixed straight line and intersecting a fixed curve. The fixed curve need not be perfectly circular or perfectly elliptical. But as mentioned above, for commonly used CR rods, the fixed curve is typically a circle that is slightly out of round or slightly elliptical. Also, the side surface can vary somewhat from end-to-end of the rod. And a "planar" surface need not be perfectly flat.

The rod 134 is machined to provide a transversely extending, upwardly opening groove in the top surface 172. The illustrated groove is a keyhole 150 located to extend generally horizontally through the rod when the rod is suspended. The keyhole 150, as viewed from the side of a suspended rod in FIG. 3A, has a neck portion 164 and a body portion 166 located below the neck portion, with the neck portion 164 of the suspended rod being narrower horizontally than the body portion 166. The illustrated body portion 166 is generally circular in cross-section. The keyhole 150 extends through the rod 134 between two locations on the side surface 135. But the lowermost portion of the keyhole could extend only partially through the rod.

The rod hanger 152 is shaped to have a mating neck portion 168 and body portion 170, with the neck portion being narrower horizontally than the body portion. The neck portion 168 of the rod hanger 152 is narrower horizontally than the neck portion 164 of the keyhole 150 of the suspended rod. And the body portion 170 of the rod hanger 152 is narrower horizontally than the body portion 166 of the keyhole 150. But the body portion 170 of the rod hanger 152 is wider horizontally than the neck portion 164 of the keyhole 150. In the system of FIG. 3A, the body portion 166 is generally circular, in vertical cross-section. The body portion 170 is partially spherical, with the diameter of body portion 170 being less than the diameter of body portion 166.

The neck portion 164 of the keyhole 150 extends through the rod 134 and defines openings at two opposed locations on the cylindrical side surface 135 of the rod. Thus, when looking at the top of a suspended rod, the neck portion 164 appears as a slot, or top of a channel, that extends across the top surface 172 of the rod between two locations on the perimeter of the top surface. Although the entire groove can extend between openings at two locations on the surface of the rod, lower portions of the groove need not extend all the way through. To simplify rod preparation, the body portion 166 of the keyhole 150 can be fabricated to extend only part way through the rod.

Figure 8:
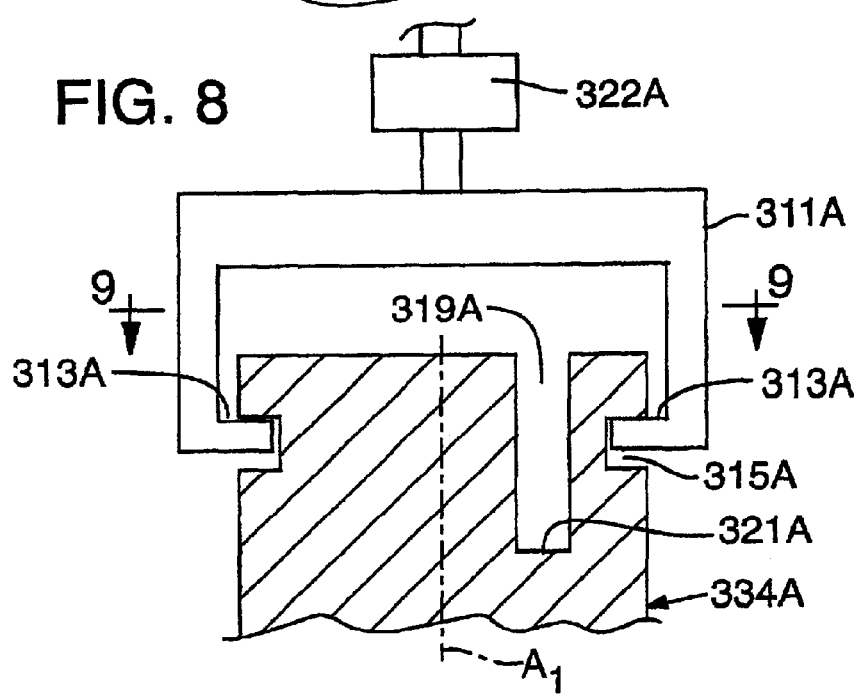
FIG. 8 is a schematic partial cross-sectional view showing a rod having an off-center groove.

Best results are achieved if the body portion 166 of the keyhole 150 extends a sufficient distance inwardly from the generally cylindrical surface 135 of the rod that the rod holder 152 can be positioned near the center axis $A_1$ of the rod 134. It is best to locate the keyhole 150 so that it extends through the central axis $A_1$ of the rod, because this makes it easiest to balance the rod to hang straight down. But a filament (not shown) located at the center axis $A_1$ of the rod may make it difficult to fabricate a keyhole through the center axis, in which case the keyhole could be located off center, for example in the manner the off center slot shown in FIG. 8. One or more additional keyholes and/or other types of slots (not shown) may also be provided in the top surface 172, but such should not be necessary.

The keyhole 150 is designed such that a rod hanger 152 will slide into hole 150 and act as a key to support the rod 134. To balance the rod to hang down straight, the rod hanger 152 should be positioned as near the center axis $A_1$ of the rod as possible. The surface of the body portion 170 advantageously flares downwardly so that when the rod hanger 152 is received in the keyhole 150 of a rod and the rod is allowed to hang, the body portion 170 will wedgingly engage the rod due to the downward force of gravity.

The depth and shape of the keyhole 150 are such that that of the bottom of the rod hanger 152 is located at an elevation above the bottom of the keyhole 150 when the rod 134 is supported by the rod hanger 152. A gap thus exists between the bottom of the rod hanger 152 and the bottom of the keyhole 150, and the bottom of the groove is below the entire RRM. Due to the presence of the gap, the polycrystalline rod 134 can be melted up to the level of the bottom of the keyhole that extends, at a level below the bottom of the rod hanger 152, between two locations on the surface of the rod. When the rod is sufficiently melted that an entire transversely extending bottom of the keyhole is melted, the remaining unmelted portion of the rod 134 consists of two or more separate pieces of polycrystalline silicon, which pieces fall away from the rod hanger 152 by gravity and into the melt. One skilled in the art can determine the size and shape of the keyhole 150, the rod hanger 152, and the gap so as to prevent molten silicon from wicking into the keyhole during melting, which wicking might prevent separation of the pieces of the remaining unmelted portion of the rod 134.

The fabrication of the keyhole is best done in a manner to prevent the generation of sharp corners, which give rise to stress risers and could cause the keyhole to fail under the weight of the rod 134. One skilled in the art can determine fabrication techniques to prevent stress risers as well as the necessary radius of curvature of all corners and sharp edges to reduce formation of stress risers.

Grooves at the top of rods, including the keyhole 150, will most commonly be generally straight and will extend perpendicular to a plane that includes the rod axis $A_1$. Such grooves are the easiest to fabricate, but it should be understood that other arrangements could be used. For example, the grooves could be slanted and/or could be not straight.

The RRM also has a seed holder 176 to which a single crystal silicon seed 178 may be mounted. The rod holder 152, the seed holder 176, and the seed 178 are rigidly connected together to provide a pivoted member. A pivot system is provided to allow the pivoted member to pivot about a generally horizontal pivot axis $A_2$. In the illustrated system, the pivot system includes a shaft 180 that is supported by the support body 160. The shaft 180 supports the seed holder 176 in such a manner that the seed holder can pivot relative to the support member 160. In particular, the seed holder 176 is secured to the shaft 180 so that the seed holder pivots with the shaft. And the shaft 180 extends through openings through the legs 174 of the support member 160 so that the shaft can pivot relative to the support member 160. Preferably the shaft is supported within low friction bearings, such as Teflon® coatings on the surfaces that define the openings that receive the shaft.

The rod holder 152 is rigidly attached to the seed holder 176 so that the seed 178 is maintained in a fixed position relative to the rod holder 152. The seed 178 extends in a direction away from the pivot axis $A_2$, and the rod holder 152 extends in the opposite direction away from the pivot axis. The free end 179 of the seed 178 and the rod holder 152 lie in a plane that includes the pivot axis $A_2$. This positioning could be accomplished in ways other than securing the rod holder 152 to the seed holder 176. For example, the rod holder could be fixedly secured directly to the shaft (not shown). And, although the illustrated construction is advantageous for balance purposes, it would be possible to design a system wherein the free end 179 of the seed 178 and the rod holder 152 would not both lie in a plane that includes the pivot axis $A_2$.

When a polycrystalline silicon rod is connected to the rod holder 152, the pivoted member will be positioned as shown in FIG. 3A with the rod holder 152 extending downwardly and seed holder 176 extending upwardly. The illustrated pivoted member has a center of gravity located such that, once the load is removed by melting of the polycrystalline silicon rod, the pivoted member inverts, to the position shown in FIG. 3B, wherein the rod holder 152 extends upwardly and seed holder 176 extends downwardly, with the seed 178 extending downwardly at a position directly below the seed cable or shaft 120. When the seed 178 extends downwardly, the free end 179 of the seed is in position to be dipped into the body of molten silicon in the crucible.

An attachment 182 connects the support body 160 to the existing seed cable or shaft 120 of the lift mechanism of a CZ furnace, so the support body 160 can be raised or lowered by appropriate operation of the seed cable or shaft.

FIG. 3C shows a rod hanger system that is similar to the hanger system shown in FIG. 3A, except that in the system of FIG. 3C, the body portions 166C and 170C are generally triangular in vertical cross-section instead of being generally circular. As in the embodiment of FIG. 3A, the neck portion 168C of the rod hanger 152C extends through the neck portion 164C of the keyhole 150C and the depth D and shape of the keyhole 150C are such that the bottom of the rod hanger 152C is located at an elevation above the bottom of the keyhole 150C when the rod 134C is supported by the rod hanger 152C. The entire groove of the rod shown in FIG. 3C extends substantially straight through the rod between two locations on the cylindrical side surface 135C. Thus the front of the rod 134C, as viewed parallel to the axis of the keyhole body portion 166C, is substantially a mirror image of the rear of the rod 134C, as viewed parallel to the axis of the keyhole body portion 166C. FIG. 3C shows how the groove can have an extension slot 174C provided below the body portion 166C that extends between two locations on the surface of the rod. Such an added slot can be provided to accelerate the separation of residual rod parts. As the lift mechanism approaches the surface of a melt, the rod will melt up to the level of that portion of the groove that is the lowest open horizontal pathway between two the rod 134C Consists of two or more separate pieces of polycrystalline silicon, which pieces fall away from the rod hanger 152C by gravity and into the melt.

In addition to the shapes shown in FIGS. 3A and 3C, other shapes can be used for the keyhole system such as a keyhole having a body portion of generally square or rectangular cross-section. The basic concept is to allow the connecting of the rod hanger 152 to the polycrystalline rod 134 such that the rod can be centered on a rod hanger 152. The keyhole 150 is fabricated such that at least the neck portion provides a slot or hole that traverses a polycrystalline silicon rod 134 between two locations on the surface of the rod to provide an open space that extends between those locations and to the top of the rod, which allows the two sections 158 of the polycrystalline rod 134 to separate from the rod hanger 152 upon melting of the rod up to the lowest open horizontal pathway provided by the groove which divides the top portion of the rod. In addition, the body portion 166 of the keyhole 150 should be larger in dimensions than the body portion 170 of the rod hanger 152 so that a gap is provided therebetween, except for a small area at the top where the surface which defines the body portion 166 engages the surface of the body portion 170.

FIGS. 4A and 4B show a RRM that is capable of holding two rods. In FIGS. 4A and 4B, elements that are similar to those shown in FIGS. 3A and 3B bear the same element numbers, but in those cases the numbers in FIGS. 4A and 4B are incremented by 100. In this system, the support body 260 has four legs, two outer legs 274 and two inner legs 275. The seed holder 276 is positioned between the two inner legs 275. And one rod holder 252 is positioned between each outer leg 274 and the nearest inner leg 275. The seed holder 276 and both of the rod holders 252 are keyed to the shaft 280, so that the seed holder 276 and rod holders 252 all pivot with the shaft about the axis $A_2$.

When silicon rods are connected to the rod holders 252, the pivoted member will be positioned as shown in FIG. 4A with the rod holders 252 extending downwardly and seed holder 276 extending upwardly. The illustrated pivoted member has a center of gravity located such that, once the load is removed by melting of the silicon rods, the pivoted member inverts, to the position shown in FIG. 4B, wherein the rod holders 252 extend upwardly and seed holder 276 extends downwardly, with the seed 278 positioned directly below the seed cable or shaft 220.

It will be appreciated that there could be numerous mechanical variations to RRM shown in FIGS. 4A and 4B. For example, additional inner legs could be provided, with rod holders located therebetween.

Figure 6:
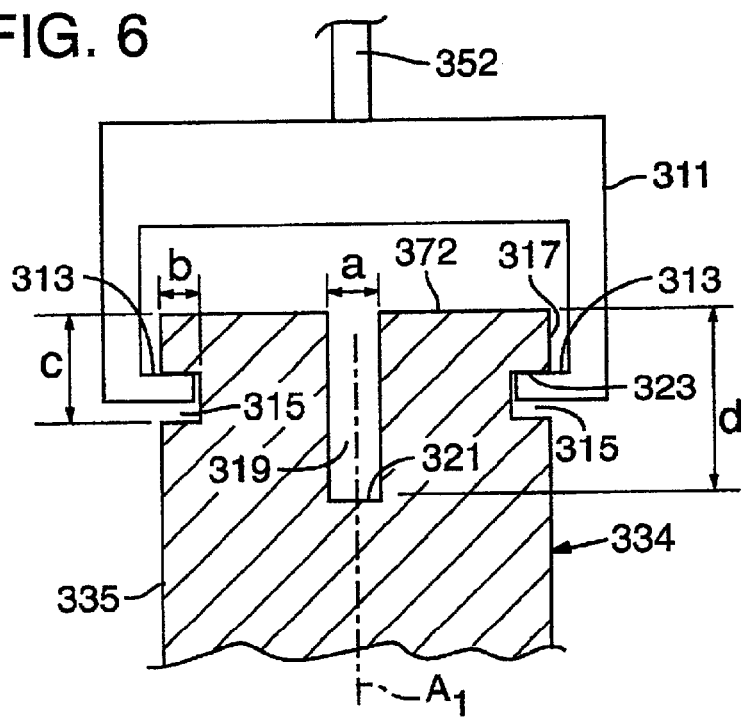
FIG. 6 is a schematic partial cross-sectional view taken along line 6—6 of FIG. 5.
Figure 7:
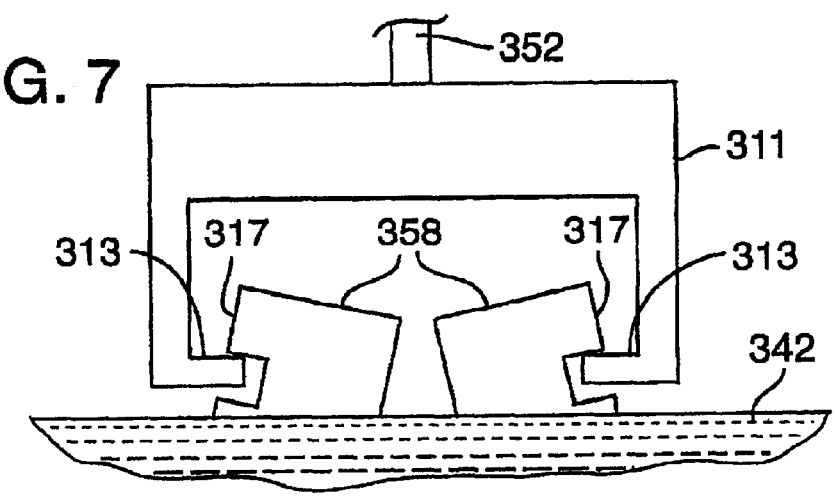
FIG. 7 is a schematic cross-sectional view showing a rod of the type illustrated in FIG. 6 being melted into a crucible.

FIGS. 5–7 show another RRM that is capable of holding two rods. In FIGS. 5–7, elements that are similar to those shown in FIGS. 3A and 3B bear the same element numbers, but such numbers are incremented by 200 in FIGS. 5–7. The primary difference of the system shown in FIGS. 5–7 is the apparatus for supporting the rods 334.

In the system of FIGS. 5–7, a ring ditch holder 311 is the distal end of each rod hanger 352. Each ring ditch holder 311 has two or more prongs 313 that extend inwardly toward the axis $A_1$ of a rod 334 being suspended. The prongs 313 are received in one or more recesses defined in the cylindrical side surface 335 of the rod 334. The one or more recesses extend inwardly from the rod surface toward the rod axis $A_1$.

More particularly in the illustrated embodiment, the one or more recesses is a single annular groove or ring ditch 315 that encircles and extends inwardly from the generally cylindrical side surface 335 at a location below the top 372 of the suspended rod 334 to provide a radially extending flange 317. The flange 317 has a lower surface 323 that extends substantially perpendicular to the axis $A_1$ and that rests on the prongs 313. The rod 334 can be lowered into a melt 342 in a crucible (not shown) using the cable or shaft 320.

An upwardly opening groove 319 is provided in the rod 334. The groove 319 has a bottom 321 at a location farther from the top surface 372 than that portion of the at least one recess that is nearest the top surface. In the illustrated system, the portion of the recess nearest the top surface is the lower surface 323 of the flange 317. Because the top surface 372 is generally flat, the groove extends across at least a portion of the top surface. If the top surface were not flat, the groove might extend across only a portion of the top surface.

For best operation, the width a of the groove 319, as measured horizontally along a line perpendicular to the groove, should be greater than twice the depth b of the ring ditch 315. And the depth d of the groove 319 should be greater than the distance c from the top 352 of the rod to the bottom of the ring ditch 315. The depth d of the groove is such that the lowermost portion of the rod hanger 352 is located at an elevation above the bottom 321 of the groove 319 when the rod 334 is supported by the rod hanger 352.

The polycrystalline rod 334 can be melted up to the level of the bottom 321 of the groove 319, at which point the remaining unmelted portion of the rod 334 consists of two or more separate pieces 358 of polycrystalline silicon, which pieces fall away from the rod hanger 352 by gravity and into the melt 342.

After the rods have melted, the holders 311, 376 rotate about the axis $A_2$ to an inverted position (not shown) such that the seed 378 points downwardly at a location directly below the cable or shaft 320. The holders 311 and seed 378 extend from the axis $A_2$ no more than a distance e, as shown in FIG. 5. To avoid undesired contact between the holders 311 or seed 378 and other portions of the RRM, the illustrated device has open regions 377 that extend above the axis $A_2$ to a distance f that is greater than the distance e.

Although the illustrated open regions 377 are all of the same height, it will be appreciated that the open regions could be of different heights, so long as each open region is tall enough to accommodate the holder 311 or seed 378 to be received therein. It should also be appreciated that an RRM could be constructed without an open region adequate to receive a holder and/or seed. For example, a support member could have an axis $A_2$ that is horizontally offset from an upper portion of the support member (not shown) so that a holder and/or seed could extend vertically alongside the upper portion, instead of between legs. Or a pivoted member could he constructed so that the holder and free end of the seed are not in a plane that includes the axis $A_1$ (not shown) such that one of the holder and the free end of the seed angles away from the support member while the other extends downwardly. But such alternate arrangements would be disadvantageous.

Figure 9:
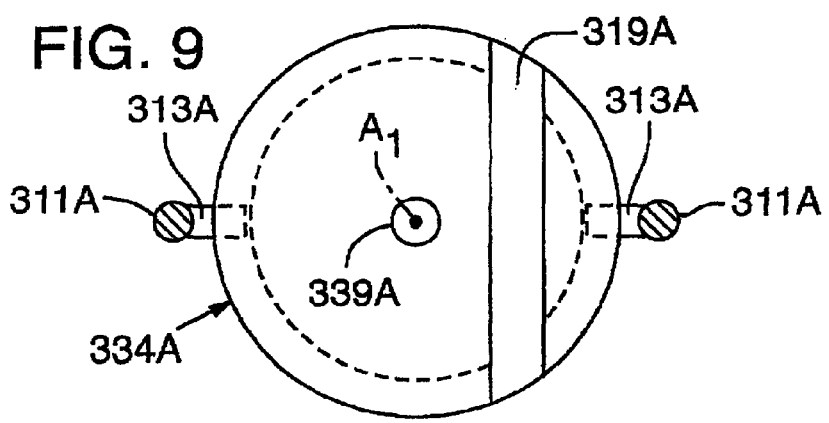
FIG. 9 is a schematic cross-sectional view taken along line 9—9 of FIG. 8.

FIG. 6 shows a groove 319 that extends through the central axis $A_1$ of the rod. But a filament (not shown) located at the center axis $A_1$ of the rod may make it difficult to fabricate a groove through the center axis, in which case the groove could be located off center. Such an off-center groove is, for example shown in FIGS. 8–9. FIG. 9 shows how the groove is located to avoid a filament 339A that is located at the axis $A_1$ of the rod 334A.

FIGS. 10A–10G illustrate various steps of a CZ process using a RRM. The illustrated RRM is the one shown in FIGS. 4A–4B. Other described RRMs, and variants thereof, operate similarly.

Figure 10A:
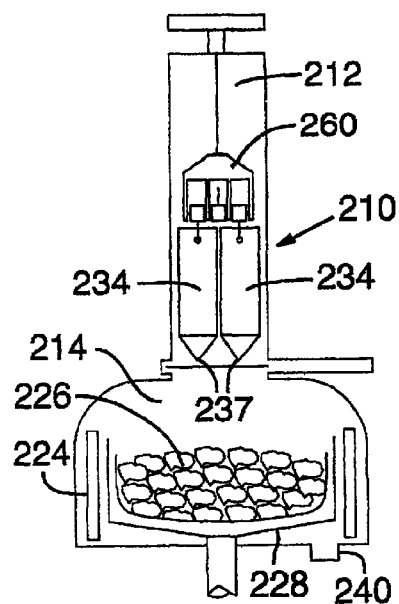
FIGS. 10A–10F are schematic vertical cross-sectional views depicting one embodiment of the use of a CR mechanism of the type shown in FIGS. 4A and 4B.

FIG. 10A shows the CZ furnace 210 loaded with polycrystalline silicon chunk 226 in the quartz crucible 228 in the lower chamber 214. In the upper chamber 212 each of two polycrystalline silicon rods 234 is shown attached through the keyhole 250 to the rod replenishment mechanism. The bottom surface of each rod 234 is conical, instead of generally planar as shown in other embodiments, with the conical surface having a vertex 237 that is the lowermost part of each suspended rod. Such an arrangement reduces the possibility of a rod fracture due to thermal shock. Both the upper and lower chambers 212, 214 are evacuated via the vacuum port 240 and the isolation valve 216 is opened.

Figure 10B:
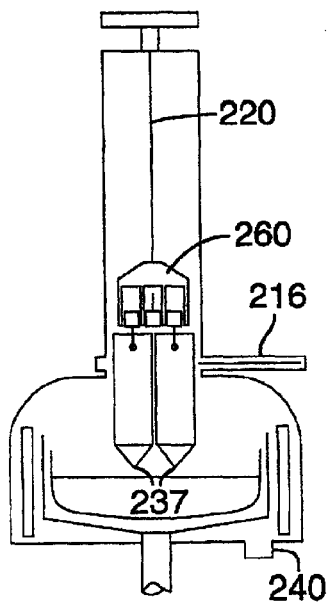
Figure 10C:
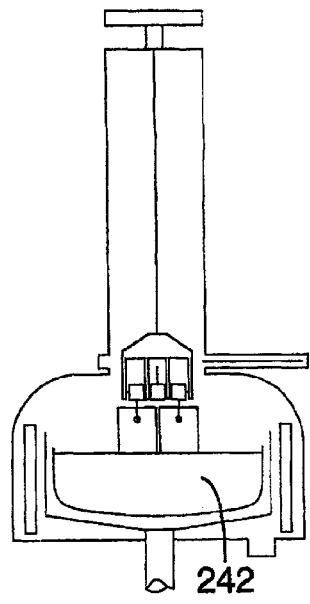

The polycrystalline silicon chunk 226 is melted using the heater 224. As the polysilicon chunk 226 is being melted the RRM is lowered into the lower chamber 214 so that the polycrystalline silicon rods 234 can be preheated. FIG. 10B shows the position of the polycrystalline silicon rod 234 just prior to contact with the molten silicon 242. The polycrystalline silicon rods 234 are lowered in the silicon melt 242 in a manner that the melting rate is equal to or faster than the lowering rate.

Figure 10D:
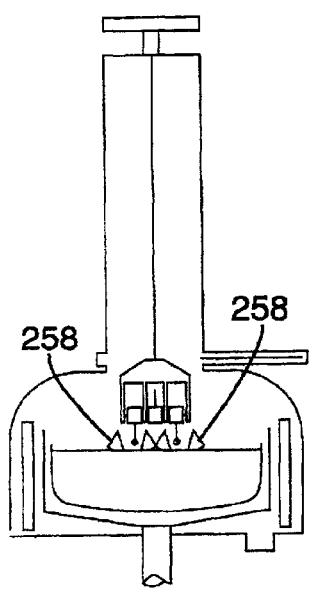

The RRM is lowered into lower furnace chamber 214 so that the polycrystalline silicon rods 234 are melted up to the bottom of the keyhole 250 as shown in FIG. 10D. When the rods melt to the lowest portions of the keyholes, each of the polycrystalline silicon rods 234 split into two or more pieces 258 that gently fall into the melt 242. This is shown in FIG. 10D.

Figure 10E:
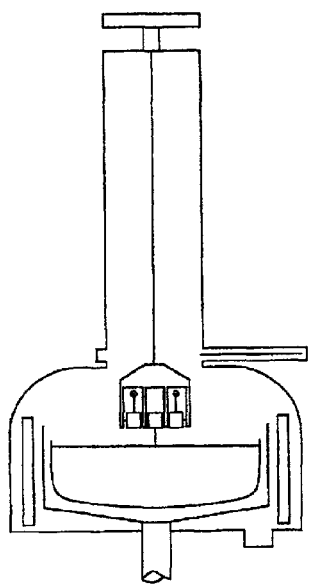
Figure 10F:
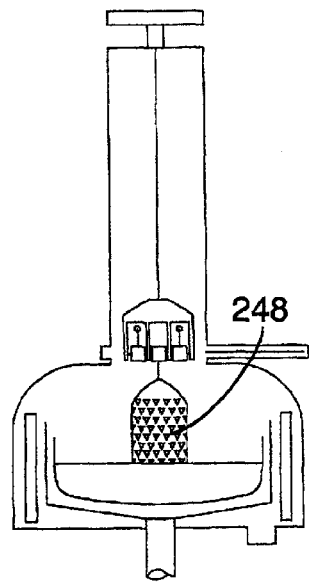

Once the polycrystalline silicon separates from the rod hangers 252, the pivoted member of the RRM inverts so that the seed holder 276 and seed 278 extend downwardly as shown in FIG. 4B. This allows the seed 278 to be lowered into the melt 242 as shown in FIG. 10E. The process of pulling a single crystal silicon ingot 248, as shown in FIG. 10F, can then proceed. The RRM is constructed so that the RRM can rotate, with the seed cable or shaft 220, during the pulling process.

In one specific example, generally according the to the process shown in FIGS. 10A–10F, 100 kg of polycrystalline chunk is loaded into a 24 inch crucible. Two polycrystalline silicon rods, each 120 mm in diameter by 900 mm in length, are attached to an RRM via keyhole attachments generally as shown in FIG. 4A. The rods each weigh 23.7 kg, for a total replenishment charge of 47.4 kg. By melting of the polycrystalline silicon rods, the molten silicon in the crucible is increased from 100 kg to 147.4 kg, a 47% increase in the amount of silicon available for converting into single crystal silicon ingot.

By using a RRM it is possible to reduce the number of times an isolation valve needs to be opened and closed, to more completely use polycrystalline silicon rods, and to reduce the total operating time.

It will be apparent that many changes may be made in the above-described embodiments. For example, although it is most common for charge replenishment rods to be made of polycrystalline silicon, such rods could be made of single crystal silicon. Thus single crystal silicon ingots that prove not to be suitable for wafer production could be machined and used as charge replenishment rods. And it will be appreciated that the bottom of an upwardly opening groove need not be perfectly flat. More importantly, the groove should be sufficiently deep that as the rod is melted from the bottom, the top of the rod separates into two or more pieces that fall into the melt. Also, although most of the illustrated embodiments show rods having top and bottom surfaces that are generally planar and that are generally perpendicular to the rod axis $A_1$, other embodiments could have other arrangements. For example, the top surface can extend at an angle to the axis $A_1$, such that the perimeter top surface is distinctly elliptical in general appearance as viewed perpendicularly to the surface. And if that angle is large enough, one end of the groove can be at the intersection of the groove with the top surface of the rod, instead of at the side surface of the rod. In such arrangements, if the rod is attached by a keyhole support mechanism, the rod holder may be received into a keyhole via an opening through the angled top surface. Also, as mentioned above, it can be advantageous for the bottom of the surface of a rod to be conical, instead of generally planar. Other configurations of top and bottom surfaces are also possible. All or a portion of a rod holder can be made from single crystal silicon seed material, in which case the rod holder, if properly oriented, may be used as a seed for dipping into the melt. In such instances, a single crystal portion of the rod holder should be constructed to be the lowermost portion of the RRM at the time of dipping. Therefore, the scope of the invention should be determined by the following claims.

What is claimed is:

1. An apparatus for growing an ingot of single crystal silicon comprising:
   a crucible adapted to contain a melt;
   a lift mechanism located over the crucible;
   a support body suspended from the lift mechanism; and
   a pivoted member comprising at least one rod holder suitable for holding a silicon rod and a single crystal seed held in a fixed position relative to the rod holder, the pivoted member being pivotally mounted on the support body for movement relative to the support body about a generally horizontal pivot axis and the pivoted member having a center of gravity located such that, when at least one silicon rod is connected to the pivoted member, the pivoted member is positioned with the rod holder extending downwardly and, when no silicon rods are connected to the pivoted member, the pivoted member is positioned with the seed extending downwardly.

2. The apparatus of claim 1 wherein:
   the support body is a yoke that has at least two spaced-apart legs; and
   the pivoted member comprises a shaft supported by at least one of the legs.

3. The apparatus of claim 2 wherein:
   at least two of the legs define openings that receive the shaft so that the shaft can pivot relative to the legs; and
   the at least one rod holder and a seed holder are secured to the shaft so that the at least one rod holder and the seed holder pivot with the shaft.

4. An apparatus for glowing an ingot of single crystal silicon comprising:

a crucible adapted to contain a melt;

a lift mechanism located over the crucible;

a support body suspended from the lift mechanism;

a pivoted member comprising at least one rod holder suitable for holding a silicon rod and a single crystal seed held in a fixed position relative to the rod holder, the pivoted member being pivotally mounted on the support body for movement relative to the support body about a generally horizontal pivot axis and the pivoted member having a center of gravity located such that, when at least one silicon rod is connected to the pivoted member, the pivoted member is positioned with the rod holder extending downwardly and, when no silicon rods are connected to the pivoted member, the pivoted member is positioned with the seed extending downwardly; and at least one rod of silicon suspended from the pivoted member such that the rod hangs over the crucible, the rod having a free end nearest the crucible and an attached end at the top of attached end, with the pivoted member engaging the rod only at a level above the bottom of the groove.

5. The apparatus of claim 4 comprising a plurality of rod holders and a plurality of silicon rods, with each of the rods being supported by one of the rod holders.

6. The apparatus of claim 4 wherein:

the groove is a keyhole that has a neck portion and a body portion located below the neck portion, with the neck portion being narrower horizontally than the body portion; and the rod holder is received in the keyhole and is shaped to have a neck portion and a body portion located below the neck portion with the neck portion of the rod holder being narrower horizontally than the neck portion of the keyhole, the body portion of the rod holder being narrower horizontally than the body portion of the keyhole, and the body portion of the rod holder being wider horizontally than the neck portion of the keyhole so that the rod rests on the head portion of the rod holder.

7. The apparatus of claim 4 wherein:

the rod has a generally cylindrical side surface that defines one or more recesses; and the pivoted member further comprises a ring ditch holder that has two or more prongs that extend generally inwardly toward the axis of the rod and that are received in the one or more recesses.

8. The apparatus of claim 7 wherein:

the one or more recesses is a ring ditch that encircles and extends inwardly from the generally cylindrical side surface at a location below the top of the rod to provide a radially extending flange that has a lower surface extending substantially perpendicular to the rod axis; and the lower surface rests on at least two of the prongs.

9. The apparatus of claim 4 wherein:

the support body is a yoke that has at least two spaced-apart legs; and the pivoted member comprises a shaft supported by at least one of the legs.

10. The apparatus of claim 9 wherein:

at least two of the legs define openings that receive the shaft so that the shaft can pivot relative to the legs; and the at least one rod holder and a seed holder are secured to the shaft so that the at least one rod holder and the seed holder pivot with the shaft.

11. A rod replenishment mechanism comprising:

a support body;

a pivoted member comprising at least one rod holder suitable for holding a rod and a single crystal seed in a fixed position relative to the rod holder, the pivoted member being pivotally mounted on the support body for movement relative to the support body about a pivot axis; and an attachment for connecting the support body to a seed cable or shaft of a CZ furnace so that when the support body is connected to the seed cable or shaft of the CZ furnace, the pivot axis will extend generally horizontally and the rod replenishment mechanism can be raised or lowered by appropriate operation of the seed cable or shaft.

12. The apparatus of claim 11 wherein:

the support body is a yoke that has at least two spaced-apart legs; and the pivoted member comprises a shaft supported by at least one of the legs.

13. The apparatus of claim 12 wherein:

at least two of the legs define openings that receive the shaft so that the shaft can pivot relative to the legs; and the at least one rod holder and a seed holder are secured to the shaft so that the at least one rod holder and the seed holder pivot with the shaft.

14. A rod replenishment mechanism comprising:

a support body;

a pivoted member comprising at least one rod holder suitable for holding a rod and a single crystal seed in a fixed position relative to the rod holder, the pivoted member being pivotally mounted on the support body for movement relative to the support body about a pivot axis, with a plane that includes the pivot axis extending through the free end of the seed and through each rod holder, the seed extending in a direction away from the pivot axis, and the rod holder extending in the opposite direction away from the pivot axis; and an attachment for connecting the support body to a seed cable or shaft of a CZ furnace so that when the support body is connected to the seed cable or shaft of the CZ furnace, the pivot axis will extend generally horizontally and the rod replenishment mechanism can be raised or lowered by appropriate operation of the seed cable or shaft.

15. The apparatus of claim 14 wherein:

the support body is a yoke that has at least two spaced-apart legs; and the pivoted member comprises a shaft supported by at least one of the legs.

16. The apparatus of claim 15 wherein:

at least two of the legs define openings that receive the shaft so that the shaft can pivot relative to the legs; and the at least one rod holder and a seed holder are secured to the shaft so that the at least one rod holder and the seed holder pivot with the shaft.

17. An apparatus for growing an ingot of single crystal silicon comprising:

a crucible adapted to contain a melt;

a lift mechanism located over the crucible;

a support body suspended from the lift mechanism; and pivotally mounted on the support body for movement relative to the support body about a generally horizontal pivot axis and the pivoted member having a center of gravity located such that, when at least one silicon rod is connected to the pivoted member, the pivoted member is positioned with the rod holder extending downwardly and, when no silicon rods are connected to the pivoted member, the pivoted member is positioned with the seed extending downwardly.

18. The apparatus of claim 17 wherein:

the support body is a yoke that has at least two spaced-apart legs; and the pivoted member comprises a shaft supported by at least one of the legs.

19. The apparatus of claim 18 wherein:

at least two of the legs define openings that receive the shaft so that the shaft can pivot relative to the legs; and the at least one rod holder and a seed holder are secured to the shaft so that the at least one rod holder and the seed holder pivot with the shaft.

20. An apparatus for growing an ingot of single crystal silicon comprising:

a crucible adapted to contain a melt;

a silicon rod that has a generally cylindrical side surface that defines one or more recesses;

a lift mechanism located over the crucible;

a support body suspended from the lift mechanism;

a pivoted member comprising at least one ring ditch holder that has two or more prongs that extend generally inwardly toward the axis of the rod and that are received in the one or more recesses and a single crystal seed in a fixed position relative to the rod holder, the pivoted member being pivotally mounted on the support body for movement relative to the support body about a generally horizontal pivot axis and the pivoted member having a center of gravity located such that, when at least one silicon rod is connected to the pivoted member, the pivoted member is positioned with the rod holder extending downwardly and, when no silicon rods are connected to the pivoted member, the pivoted member is positioned with the seed extending downwardly.

21. The apparatus of claim 20 wherein:

the support body is a yoke that has at least two spaced-apart legs; and the pivoted member comprises a shaft supported by at least one of the legs.

22. The apparatus of claim 21 wherein:

at least two of the legs define openings that receive the shaft so that the shaft can pivot relative to the legs; and the at least one rod holder and a seed holder are secured to the shaft so that the at least one rod holder and the seed holder pivot with the shaft.

23. The apparatus of claim 20 comprising a plurality of silicon rods and a plurality of ring ditch holders, with each silicon rod being supported by one of the ring ditch holders.

24. The apparatus of claim 20 wherein:

the one or more recesses is a ring ditch that encircles and extends inwardly from the generally cylindrical side surface at a location below the top of the rod to provide a radially extending flange that has a lower surface extending substantially perpendicular to the rod axis; and the lower surface rests on at least two of the prongs.

* * * * *